US005984458A

United States Patent [19]
Murai

[11] Patent Number: 5,984,458
[45] Date of Patent: Nov. 16, 1999

[54] PIEZOELECTRIC THIN-FILM ELEMENT AND INK-JET RECORDING HEAD USING THE SAME

[75] Inventor: Masami Murai, Nagano, Japan

[73] Assignee: Seiko Epson Corporation, Tokyo, Japan

[21] Appl. No.: 08/770,810

[22] Filed: Dec. 20, 1996

[30] Foreign Application Priority Data

Dec. 20, 1995 [JP] Japan ..................................... 7-332215
Nov. 25, 1996 [JP] Japan ..................................... 8-313830

[51] Int. Cl.$^6$ ...................................................... B41J 2/295
[52] U.S. Cl. .................................................. 347/68; 347/70
[58] Field of Search .......................................... 347/70, 68

[56] References Cited

U.S. PATENT DOCUMENTS

| | | | |
|---|---|---|---|
| 3,268,453 | 8/1966 | Ouchi et al. | 252/62.9 |
| 5,265,315 | 11/1993 | Hoisington et al. | 29/25.35 |
| 5,530,465 | 6/1996 | Hasegawa et al. | 347/70 |
| 5,585,136 | 12/1996 | Barrow et al. | 427/2.24 |

FOREIGN PATENT DOCUMENTS

| | | | |
|---|---|---|---|
| 0 698 490 | 2/1996 | European Pat. Off. | B41J 2/045 |
| 5-504740 | 7/1993 | Japan | B41J 2/16 |

OTHER PUBLICATIONS

Japanese Journal of Applied Physics, vol. 32, No. 9B, Sep. 1993, pp. 4144–4146; XP000615120; Sameshima K. et al.: Preparation of Pb(Zr, Ti)O$_3$ Pt/Ti/Ta Electrodes by Sol–Gel.

*Primary Examiner*—Valerie Lund
*Assistant Examiner*—Christina Annick
*Attorney, Agent, or Firm*—Sughrue, Mion, Zinn, Macpeak & Seas, PLLC

[57] ABSTRACT

A substrate; a silicon dioxide film formed on the substrate; a platinum lower electrode formed on the silicon dioxide film; a piezoelectric film formed on the platinum lower electrode; and an upper electrode formed on the piezoelectric film, wherein the relationship between a film thickness (X) of the platinum lower electrode and a film thickness (Y) of the silicon dioxide film satisfies conditions of

$0.5 \leq X/Y \leq 4$, and $3,000 \text{ Å} \leq X \leq 2 \ \mu\text{m}$.

17 Claims, 3 Drawing Sheets

PIEZOELECTRIC THIN-FILM ELEMENT AND INK-JET RECORDING HEAD USING THE SAME

BACKGROUND OF THE INVENTION

The present invention relates to a piezoelectric thin-film element and an ink-jet recording head using the same.

Conventionally, for example, in an ink-jet recording head or the like, an oscillator acting as a driving source for jetting ink is constituted by a piezoelectric thin-film element. Generally, this piezoelectric thin-film element has a structure provided with a piezoelectric thin film comprising polycrystal, and upper and lower electrodes disposed so as to hold this piezoelectric thin film therebetween.

This piezoelectric thin film is generally composed of a two-component system mainly containing lead zirconate titanate (hereinafter abbreviated to "PZT"), or a three-component system in which a third component is added to the PZT of this two-component system. The piezoelectric thin film having such a composition can be formed, for example, by a sputtering method, a sol-gel method, a laser ablation method, a CVD method or the like.

In addition, examples of conventional technique particularly relating to the present invention are disclosed in U.S. Pat. No. 5,265,315, and National Patent Publication No. Hei-5-504740.

In these conventional examples, after a silicon dioxide film is formed to be 2,500 Å on a monocrystal silicon substrate by a thermal oxidation method, a lower electrode layer of aluminum, nickel, chrome, platinum or the like is laminated thereon with a thickness of about 0.2 μm. Next, a PZT film as a piezoelectric element is laminated on the lower electrode layer with a thickness of 2 to 10 μm by a sol-gel method. Next, after an upper electrode is laminated on this PZT film, a desired process such as etching, or the like, is effected selectively from the back surface of the monocrystal silicon substrate to thereby form an ink chamber. In such a manner, an ink-jet recording head is formed.

Such an ink-jet recording head is disposed in a printer or the like. Today, however, higher resolution is requested to be realized.

In order to improve such resolution of a printer, for example, it is considered to reduce the size of the ink chamber, or to make the thickness of the piezoelectric film thinner.

However, in the above-mentioned structure and manufacturing methods, if the thickness of the piezoelectric film is made to be 5 μm or less, the boundary adhesion between the silicon dioxide film and the lower electrode film or between the lower electrode film and the PZT film is so reduced that there arises a problem that the reliability is deteriorated by the separation of the PZT film, the floating of the PZT film caused by the stress of the silicon dioxide film, and so on.

In addition, in order to obtain desired capacity of ink jetting, it is preferable to make the composition of the piezoelectric film not two-component PZT but three-component PZT.

However, when the composition of the piezoelectric film is made to be three-component PZT, it is necessary to make PZT be subjected to heat treatment at burning temperature of 800° C., so that there is a problem that the adhesion between the lower electrode film and the PZT film is reduced.

SUMMARY OF THE INVENTION

It is therefore an object of the present invention to solve such conventional problems, that is, to provide a piezoelectric thin-film element having high durability and superior reliability.

It is another object of the present invention to provide an ink-jet recording head in which high resolution and high reliability are attained, by using the above piezoelectric thin-film element.

In order to attain the foregoing objects, the present invention provides a piezoelectric thin-film element having a silicon dioxide film formed on a substrate, a platinum lower electrode formed on the silicon dioxide film, a piezoelectric film formed on the platinum lower electrode, and an upper electrode formed on the piezoelectric film; wherein the relationship between the film thickness (X) of the platinum lower electrode and the film thickness (Y) of the silicon dioxide film satisfies conditions of $0.5 \leq X/Y \leq 4$, and $3{,}000 \text{ Å} \leq X \leq 2 \mu m$. An intermediate layer may be interposed between the silicon dioxide film and the platinum lower electrode.

In the piezoelectric element having such a structure, the adhesion of the platinum lower electrode or the piezoelectric film is improved, so that high durability can be obtained and the reliability can be improved.

If the above-mentioned X/Y exceeds 4 (X/Y>4), the balance between the pulling stress of the platinum lower electrode and the compressive stress of the silicon dioxide film after sintering of the piezoelectric film is broken so that the platinum lower electrode is apt to be separated by the pulling stress of the platinum lower electrode.

On the other hand, when the above-mentioned X/Y is smaller than 0.5 (X/Y<0.5), the compressive stress of the silicon dioxide film is released so that floating is apt to be produced in the platinum lower electrode and the PZT film, or the PZT film is apt to be separated.

In addition, when the thickness (X) of the platinum lower electrode is smaller than 3,000 Å (X<3,000 Å), the adhesion of the platinum lower electrode is apt to be deteriorated by heat treatment at about 900° C. applied when the PZT film is sintered.

On the other hand, when the thickness (X) of the platinum lower electrode exceeds 2 μm (X>2 μm), the shrinkage of the platinum lower electrode becomes large by the heat applied when the PZT film is sintered, so that the adhesion of the platinum lower electrode is apt to deteriorate.

The relationship between the film thickness (X) of the platinum lower electrode and the film thickness (Y) of the silicon dioxide film may be made to satisfy conditions of $1 \leq X/Y \leq 3$, and $3{,}000 \text{ Å} \leq X \leq 1.5 \mu m$. With such a relationship, the above advantage is more improved.

The intermediate layer may contain at least titanium oxide. Thus, the adhesion of the platinum lower electrode film can be further improved. In addition, the thickness of the intermediate layer may be set to be in a range of from 200 Å to 1,500 Å.

Further, the piezoelectric film may comprising lead zirconate titanate. Furthermore, the formula of the piezoelectric film may be:

where $\alpha+\beta+\gamma=1$, and $\alpha$, $\beta$, $\gamma$ and $\delta$ are in the regions:

$0.35 \leq \alpha \leq 0.55$ $0.25 \leq \beta \leq 0.55$ $0.1 \leq \gamma \leq 0.4$ $0 \leq \delta \leq 0.3$ With such establishment, the piezoelectric distortion constant of this piezoelectric thin-film element can be made large. It is therefore possible to jet ink with high density when such a piezoelectric thin-film element is applied to an ink-jet recording head. In addition, the piezoelectric film may be formed by a sol-gel method.

In addition, the present invention provides an ink-jet recording head comprising: a base having an ink chamber formed therein; a diaphragm sealing one side of the ink chamber and having a surface to which a piezoelectric thin-film element of a deflection oscillation mode is fixed; and a nozzle plate sealing the other side of the ink chamber and having a nozzle aperture formed therein for jetting ink; wherein the piezoelectric thin-film element is constituted by a piezoelectric thin-film element described above. In the ink-jet recording head having such a structure, not only high resolution can be attained but also high reliability can be obtained.

The piezoelectric film may be formed only in an area corresponding to the ink chamber. With this formation, the above-mentioned advantage can be more improved.

DETAILED DESCRIPTION OF THE PREFERRED EMBODIMENTS

Next, embodiments according to the present invention will be described with reference to the drawings.
(Embodiment 1)

Figure 1:
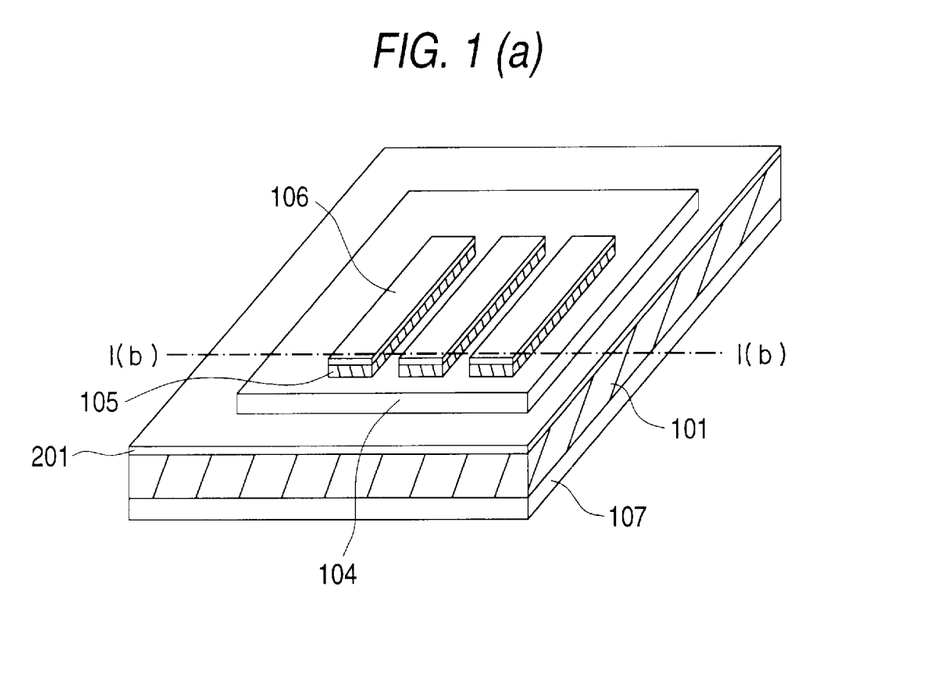
FIG. 1(a) is a perspective view illustrating an outline of an ink-jet recording head in an embodiment according to the present invention.
FIG. 1(b) is an expanded sectional view taken an line 1(b)—1(b) in FIG. 1(a)

FIG. 1(a) is a perspective view illustrating an outline of an ink-jet recording head in an embodiment of the present invention, FIG. 1(b) is an expanded sectional view taken on line 1(b)—1(b) in FIG. 1(a), and FIGS. 2(a) to 2(c) are sectional views illustrating processes to manufacture the ink-jet recording head shown in FIG. 1(a).

As shown in FIGS. 1(a) and 1(b), the ink-jet recording head according to Embodiment 1 is designed so as to have a monocrystal silicon substrate 101 in which a plurality of ink chambers 102 are formed, a piezoelectric thin-film element 110 formed on the monocrystal silicon substrate 101 through a silicon dioxide film 201, and a nozzle plate 107 which seals the ink chambers on the side opposite to the above-mentioned piezoelectric thin-film element 110 and which has nozzle apertures 108 formed therein for jetting ink.

The piezoelectric thin-film element 110 is constituted by a platinum lower electrode 104, a piezoelectric film 105 and an upper electrode 106 formed sequentially in this order from the monocrystal silicon substrate 101 side. The piezoelectric film 105 and the upper electrode 106 are disposed in positions corresponding to the ink chambers 102, respectively.

The ink chambers 102 and the nozzle apertures 108 are disposed with the same pitch as shown particularly in FIG. 1(b). The silicon dioxide film 201 is not formed in positions corresponding to the ink chambers 102.

In Embodiment 1, the length of the ink chamber 102 in the direction of array of the ink chambers 102 was set to 100 Mm, and the length of the ink chamber 102 in the depthwise direction thereof was set to 4 mm. Further, the pitch in the direction of array of the ink chambers 102 was set to 141 μm, and the resolution was set to 180 dpi (dot per inch). In addition, the length of the piezoelectric film 105 in the direction of array was set to 80 μm.

Herein, the ink-jet recording head according to Embodiment 1 has such a structure that the piezoelectric film 105 is formed only in an area corresponding to the ink chambers 102, and the piezoelectric film 105 is not formed in the area where the ink chambers 102 are not formed in the direction of array thereof. In the ink-jet recording head having such a structure, when a voltage is applied to transform the ink chambers 102, a large displacement can be obtained even if the applied voltage is small in comparison with an ink-jet recording head in which a piezoelectric film is formed also in the area where ink chambers are not formed.

Next, the process of manufacturing this ink-jet recording head will be described in accordance with the steps shown in FIGS. 2(a) to 2(c), which are cross-sectional views similar to FIG. 1(b).

Figure 2:
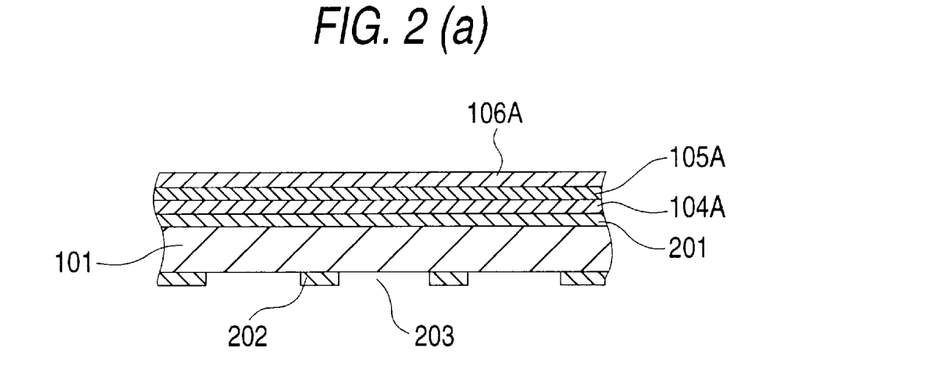
FIGS. 2(a) to 2(c) show the steps for manufacturing the ink-jet recording head shown in Figure, and are cross-sectional views similar to FIG. 1(b)

In the step shown in FIG. 2(a), the monocrystal silicon substrate 101 (substrate thickness: 220 μm) having surface orientation (110) is subjected to wet thermal oxidization at the temperature of about 1,200° C. so as to form silicon dioxide films 201 and 202 on the opposite sides of the monocrystal silicon substrate 101 at the same time.

Figure 3:
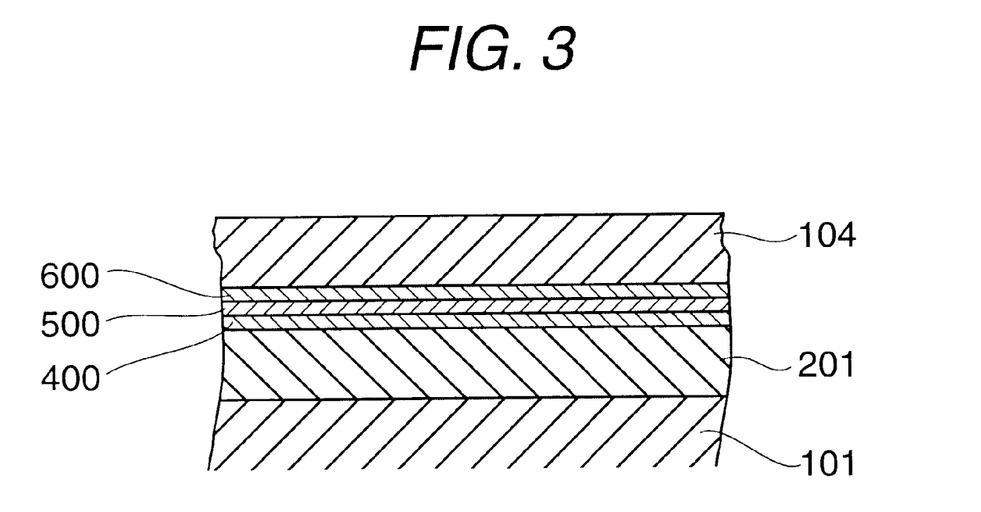
FIG. 3 is a cross-sectional view taken along line 3—3 in FIG. 1(b) showing intermediate films.

Next, a platinum lower electrode forming film 104A, a piezoelectric film forming film 105A and an upper electrode forming film 106A are formed sequentially on this silicon dioxide film 400. Practically, a titanium film (film thickness: 250 Å), a titanium dioxide film 500 (film thickness: 200 Å) and a titanium film 600 (film thickness: 50 Å) (see FIG. 3) were formed sequentially between the silicon dioxide film 201 and the platinum lower electrode forming film 104A as intermediate films for improving the adhesion of the films 201 and 104A. These intermediate layers and the platinum lower electrode forming film 104A were formed continuously by a DC sputtering method. The titanium dioxide film was formed by a reactive sputtering method with 10% oxygen atmosphere.

The piezoelectric film forming film 105A was formed to be 3 μm thick by a sol-gel method. At that time, 0.105 mol of lead acetate, 0.045 mol of zirconium acetyl acetate, 0.005 mol of magnesium acetate and 30 ml of acetic acid were heated to 100° C. to as to be dissolved, and thereafter cooled to the room temperature; 0.040 mol of titanium tetraisopropoxide and 0.010 mol of pentaethoxyniobate were dissolved into 50 ml of ethyl cellosolve and added thereto; 30 ml of acetylacetone was added thereto so as to stabilize; and thereafter polypropylene glycol (average molecular weight 400) was added by 30 weight % to the metallic oxide in the sol, and agitated well so that the uniform sol was obtained as material for the piezoelectric film forming film 105A to be formed by the sol-gel method.

Next, the thus prepared sol was applied onto the platinum lower electrode forming film 104A by spin coating and temporarily sintered at 400° C. so as to form an amorphous porous gel thin film 0.3 μm thick. Further, the steps of coating with the sol and temporary sintering at 400° C. were repeated twice so as to form a porous gel thin film 0.9 μm thick. Next, the thin film was heated to 650° C. for 5 seconds in oxygen atmosphere by RTA (Rapid Thermal Annealing), and kept in this state for 1 minute to perform preannealing to thereby form a minute thin film 0.6 μm thick. These steps were repeated five times so as to obtain an amorphous minute thin film 3.0 µm thick.

Next, the thin film was heated to 900° C. in oxygen atmosphere by RTA, and kept in this state for 1 inute to perform annealing. The piezoelectric film forming film 105A 3.0 µm thick was obtained in such a manner.

Next, when the obtained piezoelectric film forming film 105A was dissolved by fluoric acid, and quantatively determined by ICP (plasma emission analysis), the molar ratio (Pb:Mg:Nb:Zr:Ti) was (1.00:0.05:0.10:0.45:0.40).

In addition, when the solid state properties were measured after polarization, superior properties were shown such that the specific inductive capacity was 2,000, and the piezoelectric distortion constant was 150 pC/N. Since the electromechanically coupling coefficient was high though the specific inductive capacity was not extremely high, such a large piezoelectric distortion constant could be obtained.

Next, the upper electrode forming film 106A comprising platinum is formed to be 200 Å thick on the obtained piezoelectric film forming film 105A by a DC sputtering method.

Next, a photo resist film (not-shown) is formed on the silicon dioxide film 202, and the portions of this photo resist film corresponding to the areas where the ink chambers 102 will be formed are removed selectively so as to form a photo mask (not-shown). Next, using this photo mask as a mask, the silicon dioxide film 202 is patterned with a water solution of fluoric acid and ammonium fluoride so as to form aperture portions 203. Here, the depthwise direction of these aperture portions 203, that is, the direction perpendicular to the paper of drawing is defined as the <112> direction of the monocrystal silicon substrate 101.

Next, in the step shown in FIG. 2(b), a photo mask (not-shown) is formed on the upper electrode forming film 106 in the portion corresponding to the area where the upper electrode will be formed. Next, using this photo mask as a mask, the upper electrode forming film 106A and the piezoelectric film forming film 105A are etched by ion milling so as to form the upper electrode 106 and the piezoelectric film 105. Next, the lower platinum electrode forming film 104A is patterned to obtain the platinum lower electrode 104. The piezoelectric thin-film element 110 constituted by the upper electrode 106, the piezoelectric film 105 and the platinum lower electrode 104 was formed in such a manner.

Next, in the step shown in FIG. 2(c), the monocrystal silicon substrate 101 is protected by a jig (not-shown) at the side where the piezoelectric thin-film element 110 is formed. Next, this substrate is immersed in a water solution of potassium hydrate which is heated to 80° C., and anisotropic etching is performed on the monocrystal silicon film 101 by using, as a mask, the silicon dioxide film 202 having the aperture portions 203 formed therein until the silicon dioxide film 201 is exposed.

At this time, since the surface orientation of the monocrystal silicon substrate 101 is (110), and since the depthwise direction of the aperture portions 203 is the <112> direction, the surfaces of the depthwise side walls of the ink chambers 102 can be made (111) surfaces.

Then, when a water solution of potassium hydrate is used as an etching solution for anisotropic etching, the ratio of etching rate between the (110) surface and the (111) surface of the monocrystal silicon substrate 101 becomes about 300:1, so that grooves 220 µm deep in the monocrystal silicon substrate 101 can be limited to about 1 µm side etching. Accordingly, the ink chambers 102 can be formed accurately.

Next, while the jig is fixed, the silicon dioxide film 202 and the exposed silicon dioxide film 201 are etched so as to be removed with a water solution of fluoric acid and ammonium fluoride. The ink chambers 102 were formed in such a manner.

Next, the film thickness of the silicon dioxide films 201 and 202 and the film thickness of the platinum lower electrode 104 were varied, and respective frequencies of occurrence of the floating or separation of the piezoelectric film 105 and the separation of the platinum lower electrode 104 were evaluated. This result is shown in Table 1.

In addition, other examples were also evaluated in the same manner for the sake of comparison.

The unit of film thickness was expressed by µm. In addition, the frequencies of occurrence were evaluated per head. The number of nozzles of an ink-jet recording head in this embodiment was 128, and it was determined that failure occurred even when floating or separation of a film appeared in only one of the nozzles. Criteria were set as follow.
(Criteria)

Percent defective appearing in the platinum lower electrode or the piezoelectric film exceeded 2%: x Percent defective appearing in the platinum lower electrode or the piezoelectric film was 0.5 to 2%: ○

Percent defective appearing in the platinum lower electrode or the piezoelectric film was smaller than 0.5%: ⊙

TABLE 1

| NO. OF EXAMPLE | | SILICON DIOXIDE FILM | PLATINUM ELECTRODE | PLATINUM ELECTRODE / SILICON DIOXIDE FILM | (III) | (IV) | (V) |
|---|---|---|---|---|---|---|---|
| (I) | 1 | 0.3 | 0.2 | 0.67 | 22.6% | 5.8% | x |
| | 2 | 0.9 | 0.4 | 0.44 | 3.2% | 31.6% | x |
| | 3 | 0.1 | 0.8 | 8.00 | 18.9% | 1.8% | x |
| | 4 | 1.8 | 0.8 | 0.44 | 2.9% | 26.4% | x |
| | 5 | 0.4 | 1.8 | 4.50 | 12.2% | 2.1% | x |
| | 6 | 1.0 | 2.2 | 2.20 | 39.8% | 1.2% | x |
| | 7 | 0.7 | 0.3 | 0.43 | 1.3% | 2.4% | x |
| | 8 | 0.2 | 1.5 | 7.50 | 33.2% | 1.2% | x |
| | 9 | 0.4 | 2.0 | 5.00 | 4.2% | 2.3% | x |
| (II) | 10 | 0.3 | 0.4 | 1.33 | 0.4% | 0.2% | ⊙ |
| | 11 | 0.5 | 0.4 | 0.80 | 0.4% | 0.4% | ○ |
| | 12 | 0.7 | 0.4 | 0.57 | 0.5% | 0.6% | ○ |
| | 13 | 0.3 | 0.8 | 2.67 | 0.3% | 0.3% | ⊙ |
| | 14 | 0.5 | 0.8 | 1.60 | 0.2% | 0.3% | ⊙ |
| | 15 | 0.7 | 0.8 | 1.14 | 0.2% | 0.3% | ⊙ |

TABLE 1-continued

| NO. OF EXAMPLE | SILICON DIOXIDE FILM | PLATINUM ELECTRODE | PLATINUM ELECTRODE / SILICON DIOXIDE FILM | (III) | (IV) | (V) |
|---|---|---|---|---|---|---|
| 16 | 1.0 | 0.8 | 0.80 | 0.6% | 0.8% | ○ |
| 17 | 1.4 | 0.8 | 0.57 | 0.6% | 1.1% | ○ |
| 18 | 0.8 | 1.8 | 2.25 | 1.3% | 0.6% | ○ |
| 19 | 1.2 | 1.8 | 1.50 | 1.4% | 0.6% | ○ |
| 20 | 0.3 | 0.3 | 1.00 | 1.3% | 1.5% | ○ |
| 21 | 0.5 | 0.3 | 0.60 | 1.4% | 1.8% | ○ |
| 22 | 0.6 | 1.5 | 2.50 | 0.3% | 0.3% | ⊚ |
| 23 | 1.2 | 1.5 | 1.25 | 0.2% | 0.4% | ⊚ |
| 24 | 0.5 | 2.0 | 4.00 | 1.9% | 1.8% | ○ |
| 25 | 1.0 | 2.0 | 2.00 | 1.8% | 1.5% | ○ |

(I): COMPARATIVE EXAMPLES
(II): EXAMPLES
(III): SEPARATION OF ELECTRODE
(IV): SEPARATION OF PZT
(V): EVALUATION

As shown in Table 1, it was confirmed that there was a correlation between the film thickness of the silicon dioxide film and the film thickness of the platinum lower electrode, and the separation of the platinum lower electrode and the separation or floating of the piezoelectric film.

That is, when the film thickness of the platinum lower electrode is smaller than 3,000 Å, lead in the piezoelectric film is dispersed into the platinum lower electrode and the silicon dioxide film by heat treatment of 900° C. applied when the piezoelectric film is sintered, so that the adhesion of the platinum lower electrode is apt to decrease extremely.

On the other hand, when the film thickness of the platinum lower electrode exceeds 2 µm, the shrinkage of the platinum lower electrode is made large by heat applied when the piezoelectric film is sintered, so that the adhesion of the platinum lower electrode is apt to decrease.

When (the film thickness of the platinum lower electrode)/(the film thickness of the silicon dioxide film)>4, the balance between the pulling stress of the platinum film and the compressive stress of the silicon dioxide film after sintering of the piezoelectric film is broken, so that the platinum lower electrode is apt to be separated by pulling stress of the platinum film.

On the other hand, when (the film thickness of the platinum lower electrode)/(the film thickness of the silicon dioxide film)<0.5, the compressive stress of the silicon dioxide film is released, so that floating appears in the platinum lower electrode and the piezoelectric film, or separation occurs in the piezoelectric film. This is a phenomenon caused by the fact that the compressive stress of the silicon dioxide film is released when the ink chambers are formed because the monocrystal silicon substrate which has supported the compressive stress of the silicon dioxide film is removed.

On the other hand, when (the film thickness of the platinum lower electrode)/(the film thickness of the silicon dioxide film)≧0.5, the pulling stress of the platinum lower electrode is larger than the compressive stress of the silicon dioxide film so that no floating occurs in the piezoelectric film.

In order to ensure the adhesion of the platinum lower electrode and in order to prevent the piezoelectric film from floating or separating, it is therefore necessary to set the film thicknesses of the silicon dioxide film and the platinum lower electrode to satisfy the condition that 0.5≦(the thickness of the platinum lower electrode)/(the thickness of the silicon dioxide film)≦4 and to set the film thickness of the platinum lower electrode to satisfy the condition that 3,000 Å≦(the thickness of the platinum lower electrode)≦2 µm.

Further, it is preferable to set the film thicknesses of the silicon dioxide film and the platinum lower electrode to satisfy the condition that 1≦(the thickness of the platinum lower electrode)/(the thickness of the silicon dioxide film)≦3 and to set the film thickness of the platinum lower electrode to satisfy the condition that 3,000 Å≦(the thickness of the platinum lower electrode)≦1.5 µm.

Next, an ink-jet recording head having the same structure as the sample number 14 shown in Table 1 was prepared, and its durability was examined. This examination employed such a method that a rectangular waveform voltage with a pulse width if 1 millisecond and a voltage of 30 V was applied to a piezoelectric thin-film element $1 \times 10^8$ times, and ink jetting was evaluated before and after the application of the voltage. As a result, it could be confirmed that there was no change in the ink-jet recording head having such a structure, so that its reliability was extremely high.

Although the whole of the silicon dioxide film 201 exposed in the ink chambers 102 was removed by etching in Embodiment 1, the present invention is not limited to this, but the silicon dioxide film 201 exposed in the ink chambers 102 may be partly removed, or the whole of the silicon dioxide film 201 may be left as it is without being removed. Even in this case, it is a matter of course that similar effects can be obtained because the monocrystal silicon film having supported the compressive stress of the silicon dioxide film is removed in the same manner as in Embodiment 1 when the ink chambers 102 are formed.

In addition, even in the case where the composition of the piezoelectric film 105 is a two-component system of lead zirconate titanate, satisfactory ink jetting property can be obtained if the thickness of the piezoelectric film is made large. It is however preferable, in order to obtain a ink-jet recording head with high density, that the formula of the composition of the piezoelectric film is:

where $\alpha+\beta+\gamma=1$, and $\alpha$, $\beta$, $\gamma$ and $\delta$ in the aforementioned formula are in the ranges of:

$0.35 \leq \alpha \leq 0.55$ $0.25 \leq \beta \leq 0.55$ $0.1 \leq \gamma \leq 0.4$ $0 \leq \delta \leq 0.3$ This is because the piezoelectric distortion constant is low to be about 100 pC/N in a piezoelectric film of a two-component system so that the thickness necessary for sufficient ink jetting is larger than that a piezoelectric film of a three-component system.

Although the thickness of the piezoelectric film is set to 3 μm in Embodiment 1, the present invention is not limited to this. Effects similar to those mentioned above can be obtained if the thickness of the piezoelectric film is set to 5 μm or less, because the separation of the piezoelectric film is caused by breaking in the balance of stress between the silicon dioxide film and the platinum lower electrode.

(Embodiment 2)

Ink-jet recording heads in which the film thickness of the silicon dioxide film 201 was set to 5,000 Å, the film thickness of the platinum lower electrode 104 was set to 8,000 Å, and the structure of an intermediate layer was changed from that in the ink-jet recording head prepared in Embodiment 1, were made on trial, and the separation of the platinum lower electrode 104 and the piezoelectric distortion constant were examined thereon. The intermediate layer was made to be a single-layer or multi-layer film, and a first titanium layer, a titanium oxide layer and a second titanium layer were formed sequentially on the silicon dioxide film 201.

The four layers, including the first titanium layer, the titanium oxide layer and the second titanium layer, constituting the intermediate layer, and the platinum lower electrode 104 were formed continuously by a DC sputtering method. In addition, the titanium oxide layer was formed by a reactive sputtering method with 10% oxygen atmosphere. The structure and manufacturing process of the other films were the same as in Embodiment 1.

The structure of the intermediate layer and the evaluation result are shown in Table 2. The unit of film thickness was expressed by Å, and the unit of piezoelectric distortion constant was expressed by pC/N. Criteria were set as follow.

(Criteria)

The separation occurrence rate of the platinum lower electrode exceeded 5%: x

The separation occurrence rate of the platinum lower electrode was in a range of from 0.5 to 5%: ○

The separation occurrence rate of the platinum lower electrode was smaller than 0.5%: ⊙

TABLE 2

| NO. OF EXAMPLE | | FIRST TITANIUM LAYER 1 | TITANIUM OXIDE LAYER | SECOND TITANIUM LAYER 2 | SEPARATION OF ELECTRODE | (III) | (IV) |
|---|---|---|---|---|---|---|---|
| (I) | 1 | 50 | 0 | 0 | 72.6% | 102 | x |
| | 2 | 100 | 0 | 0 | 55.1% | 108 | x |
| | 3 | 200 | 0 | 0 | 43.5% | 110 | x |
| | 4 | 500 | 0 | 0 | 40.2% | 115 | x |
| | 5 | 50 | 100 | 0 | 11.0% | 125 | x |
| | 6 | 800 | 700 | 100 | 5.5% | 105 | x |
| | 7 | 100 | 100 | 0 | 3.1% | 130 | ○ |
| | 8 | 100 | 100 | 50 | 1.9% | 138 | ○ |
| | 9 | 200 | 100 | 50 | 0.5% | 140 | ⊙ |
| (II) | 10 | 200 | 200 | 0 | 1.5% | 132 | ○ |
| | 11 | 200 | 200 | 50 | 0.4% | 150 | ⊙ |
| | 12 | 200 | 300 | 50 | 0.4% | 148 | ⊙ |
| | 13 | 200 | 200 | 100 | 0.8% | 139 | ○ |
| | 14 | 200 | 200 | 200 | 1.4% | 133 | ○ |
| | 15 | 200 | 300 | 100 | 0.7% | 135 | ○ |
| | 16 | 200 | 500 | 50 | 1.8% | 134 | ○ |
| | 17 | 300 | 200 | 50 | 0.4% | 150 | ⊙ |
| | 18 | 400 | 200 | 50 | 0.5% | 142 | ⊙ |
| | 19 | 500 | 200 | 50 | 0.6% | 136 | ○ |
| | 20 | 500 | 300 | 50 | 0.6% | 135 | ○ |
| | 21 | 500 | 500 | 50 | 1.3% | 125 | ○ |

(I): COMPARATIVE EXAMPLES
(II): EXAMPLES
(III): PIEZOELECTRIC DISTORTION CONSTANT
(IV): EVALUATION

It was proved, from Table 2, that the adhesion of the platinum lower electrode is extremely low when the intermediate layer does not include a titanium oxide layer. It was further proved that the intermediate layer does not have a function as an adhesion layer with respect to the platinum lower electrode when the intermediate layer is thinner than 200 Å even if the intermediate layer includes a titanium oxide layer. Further, if the film thickness of the intermediate layer exceeds 500 Å, it is possible to ensure the adhesion, but the piezoelectric distortion constant becomes small so that it is not suitable for making the density high.

In the intermediate layer, it is particularly preferable to set the film thickness of the first titanium layer formed on the silicon dioxide film 201 side to be in a range of from 200 to 400 Å, to set the film thickness of the titanium oxide layer to be in a range of from 100 to 300 Å, and to set the film thickness of the second titanium layer formed on the titanium oxide layer to be in a range of 50 to 100 Å.

When the intermediate layer is designed so as to have such a configuration, and if the film thickness of the intermediate layer is set to be in a range of from 200 to 1,500 Å, more preferably in a range of from 300 to 800 Å, it is possible to obtain a piezoelectric element superior in the adhesion of the platinum lower electrode and superior in the piezoelectric properties.

As has been described above, according to the present invention, it is possible to prevent a platinum lower electrode from separating or prevent a piezoelectric film from floating/separating, even in high-temperature treatment of a piezoelectric film of a three-component system which is indispensable for obtaining a large piezoelectric distortion constant. It is therefore possible to obtain a piezoelectric element superior in durability and high in reliability. Further, by using this piezoelectric thin-film element, it is possible to obtain an ink-jet recording head in which high resolution and high reliability can be attained. In addition, since the piezoelectric element can be made to be a thin film, it is possible to obtain an ink-jet recording head with high resolution.

What is claimed is:

1. A piezoelectric thin-film element in combination with a substrate and a silicon dioxide film, said piezoelectric thin-film element comprising:

a platinum lower electrode formed on the silicon dioxide film, the silicon dioxide film being formed on the substrate;

a piezoelectric film formed on the platinum lower electrode; and an upper electrode formed on the piezoelectric film, wherein the relationship between a film thickness (X) of the platinum lower electrode and a film thickness (Y) of the silicon dioxide film satisfies conditions of:

$0.5 \leq X/Y \leq 4$, and $3{,}000 \text{ Å} \leq X \leq 2 \text{ } \mu m$.

2. The piezoelectric thin-film element in combination with the substrate and the silicon dioxide film according to claim 1, further comprising an intermediate layer between the silicon dioxide film and the platinum lower electrode.

3. The piezoelectric thin-film element in combination with the substrate and the silicon dioxide film according to claim 1, wherein the relationship between the film thickness (X) of the platinum lower electrode and the film thickness (Y) of the silicon dioxide film satisfies conditions of:

$1 \leq X/Y \leq 3$, and $3{,}000 \text{ Å} \leq X \leq 1.5 \text{ } \mu m$.

4. The piezoelectric thin-film element in combination with the substrate and the silicon dioxide film according to claim 2, wherein the intermediate layer includes at least titanium oxide.

5. The piezoelectric thin-film element in combination with the substrate and the silicon dioxide film according to claim 2, wherein the thickness of the intermediate layer is in a range of from 200 Å to 1,500 Å.

6. The piezoelectric thin-film element in combination with the substrate and the silicon dioxide film according to claim 1, wherein the piezoelectric film comprises lead zirconate titanate.

7. The piezoelectric thin-film element in combination with the substrate and the silicon dioxide film according to claim 1, wherein the formula of the piezoelectric film is:

$PbTi_\alpha Zr_\beta (Mg_{1/3}Nb_{2/3})_\gamma O_3 + \delta PbO$ where $\alpha + \beta + \gamma = 1$, and $\alpha$, $\beta$, $\gamma$ and $\delta$ are in the regions:

$0.35 \leq \alpha \leq 0.55$ $0.25 \leq \beta \leq 0.55$ $0.1 \leq \gamma \leq 0.4$ $0 \leq \delta \leq 0.3$.

8. The piezoelectric thin-film element in combination with the substrate and the silicon dioxide film according to claim 1, wherein the piezoelectric film is formed by a sol-gel method.

9. An ink-jet recording head comprising:

a substrate, said substrate having an ink chamber formed therein;

a silicon dioxide film formed on one side of the substrate;

a piezoelectric thin-film element formed on the silicon dioxide film and comprising:

a platinum lower electrode formed on the silicon dioxide film, a piezoelectric film formed on the platinum lower electrode, and an upper electrode formed on the piezoelectric film, wherein the relationship between a film thickness (X) of the platinum lower electrode and a film thickness (Y) of the silicon dioxide film satisfies the conditions of:

$0.5 \leq X/Y \leq 4$, and $3{,}000 \text{ Å} \leq X \leq 2 \text{ } \mu m$; and a nozzle plate formed on another side of the substrate and having a nozzle aperture formed therein for jetting ink from the ink chamber.

10. The ink-jet recording head according to claim 9, further comprising an intermediate layer between the silicon dioxide film and the platinum lower electrode.

11. The ink-jet recording head according to claim 9, wherein the relationship between the film thickness (X) of the platinum lower electrode and the film thickness (Y) of the silicon dioxide film satisfies conditions of $1 \leq X/Y \leq 3$, and $3{,}000 \text{ Å} \leq X \leq 1.5 \text{ } \mu m$.

12. The ink-jet recording head according to claim 10, wherein the intermediate layer includes at least titanium oxide.

13. The ink-jet recording head according to claim 10, wherein the thickness of the intermediate layer is in a range of from 200 Å to 1,500 Å.

14. The ink-jet recording head according to claim 9, wherein the piezoelectric film comprises lead zirconate titanate.

15. The ink-jet recording head according to claim 9, wherein the formula of the piezoelectric film is:

$PbTi_\alpha Zr_\beta (Mg_{1/3}Nb_{2/3})_\gamma O_3 + \delta PbO$ where $\alpha + \beta + \gamma = 1$, and $\alpha$, $\beta$, $\gamma$ and $\delta$ are in the regions:

$0.35 \leq \alpha \leq 0.55$ $0.25 \leq \beta \leq 0.55$ $0.1 \leq \gamma \leq 0.4$ $0 \leq \delta \leq 0.3$.

16. The ink-jet recording head according to claim 9, wherein the electric film is formed by a sol-gel method.

17. The ink-jet recording head according to claim 9, wherein the electric film is formed only in an area corresponding to the ink chamber.

* * * * *